(12) United States Patent
Hsu et al.

(10) Patent No.: US 10,170,536 B1
(45) Date of Patent: Jan. 1, 2019

(54) MAGNETIC MEMORY WITH METAL OXIDE ETCH STOP LAYER AND METHOD FOR MANUFACTURING THE SAME

(71) Applicant: TAIWAN SEMICONDUCTOR MANUFACTURING COMPANY LTD., Hsinchu (TW)

(72) Inventors: Hung-Wen Hsu, Tainan (TW); Yen-Shuo Su, Hsinchu County (TW); Jiech-Fun Lu, Tainan County (TW); Kuan Chih Huang, Tainan (TW); Tze Yun Chou, Tainan (TW); Chun-Mao Chiu, Kaohsiung (TW); Tao-Sheng Chang, Tainan (TW)

(73) Assignee: TAIWAN SEMICONDUCTOR MANUFACTURING COMPANY LTD., Hsinchu (TW)

( * ) Notice: Subject to any disclaimer, the term of this patent is extended or adjusted under 35 U.S.C. 154(b) by 0 days.

(21) Appl. No.: 15/626,686

(22) Filed: Jun. 19, 2017

(51) Int. Cl.
| H01L 43/08 | (2006.01) |
| H01L 49/02 | (2006.01) |
| H01L 21/768 | (2006.01) |
| H01L 23/31 | (2006.01) |
| H01L 23/528 | (2006.01) |
| H01L 23/522 | (2006.01) |

(52) U.S. Cl.
CPC ........ *H01L 28/10* (2013.01); *H01L 21/76829* (2013.01); *H01L 23/3171* (2013.01); *H01L 23/528* (2013.01); *H01L 23/5226* (2013.01)

(58) Field of Classification Search
CPC ... H01L 28/10; H01L 23/5226; H01L 23/528; H01L 21/76829; H01L 23/3171
See application file for complete search history.

(56) References Cited

U.S. PATENT DOCUMENTS

| 9,490,164 | B1* | 11/2016 | Engelmann | ....... H01L 21/76829 |
| 2011/0237055 | A1* | 9/2011 | Son | ...................... H01L 27/0688 |
| | | | | 438/486 |
| 2016/0307991 | A1* | 10/2016 | Kuo | ......................... H01L 28/10 |
| 2016/0351799 | A1* | 12/2016 | Xue | ......................... H01L 43/12 |
| 2017/0069684 | A1* | 3/2017 | Suh | ......................... H01L 43/12 |
| 2018/0137966 | A1* | 5/2018 | Tseng | ...................... H01L 28/10 |

\* cited by examiner

*Primary Examiner* — Selim Ahmed
(74) *Attorney, Agent, or Firm* — WPAT, P.C., Intellectual Property Attorneys; Anthony King

(57) ABSTRACT

A semiconductor structure is disclosed. The semiconductor structure includes: a substrate; a first passivation layer over the substrate; a second passivation layer over the first passivation layer; a magnetic layer in the second passivation layer; and an etch stop layer between the magnetic layer and the first passivation layer, wherein the etch stop layer includes at least one acid resistant layer, and the acid resistant layer includes a metal oxide. A method for manufacturing a semiconductor structure is also disclosed.

20 Claims, 20 Drawing Sheets

MAGNETIC MEMORY WITH METAL OXIDE ETCH STOP LAYER AND METHOD FOR MANUFACTURING THE SAME

BACKGROUND

Generally, an inductor is a passive electrical component that can store energy in a magnetic field created by an electric current passing through it. An inductor may be constructed as a coil of conductive material wrapped around a core of dielectric or magnetic material. One parameter of an inductor that may be measured is the inductor's ability to store magnetic energy, also known as the inductor's inductance. Another parameter that may be measured is the inductor's Quality (Q) factor. The Q factor of an inductor is a measure of the inductor's efficiency and may be calculated as the ratio of the inductor's inductive reactance to the inductor's resistance at a given frequency.

Traditionally, inductors are used as discrete components which are placed on a substrate such as a printed circuit board (PCB) and connected to other parts of the system, such as an integrated circuit (IC) chip, via contact pads and conductive traces. Discrete inductors are bulky, require larger footprints on the PCB, and consume lots of power. Due to the continued miniaturization of electric devices, it is desirable to integrate inductors into IC chips. Therefore, there is a need for manufacturing integrated inductors that provide the benefit of size, cost and power reduction without sacrificing the electrical performance.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. Specifically, dimensions of the various features may be arbitrarily increased or reduced for clarity of discussion.

DETAILED DESCRIPTION

Figure 1:
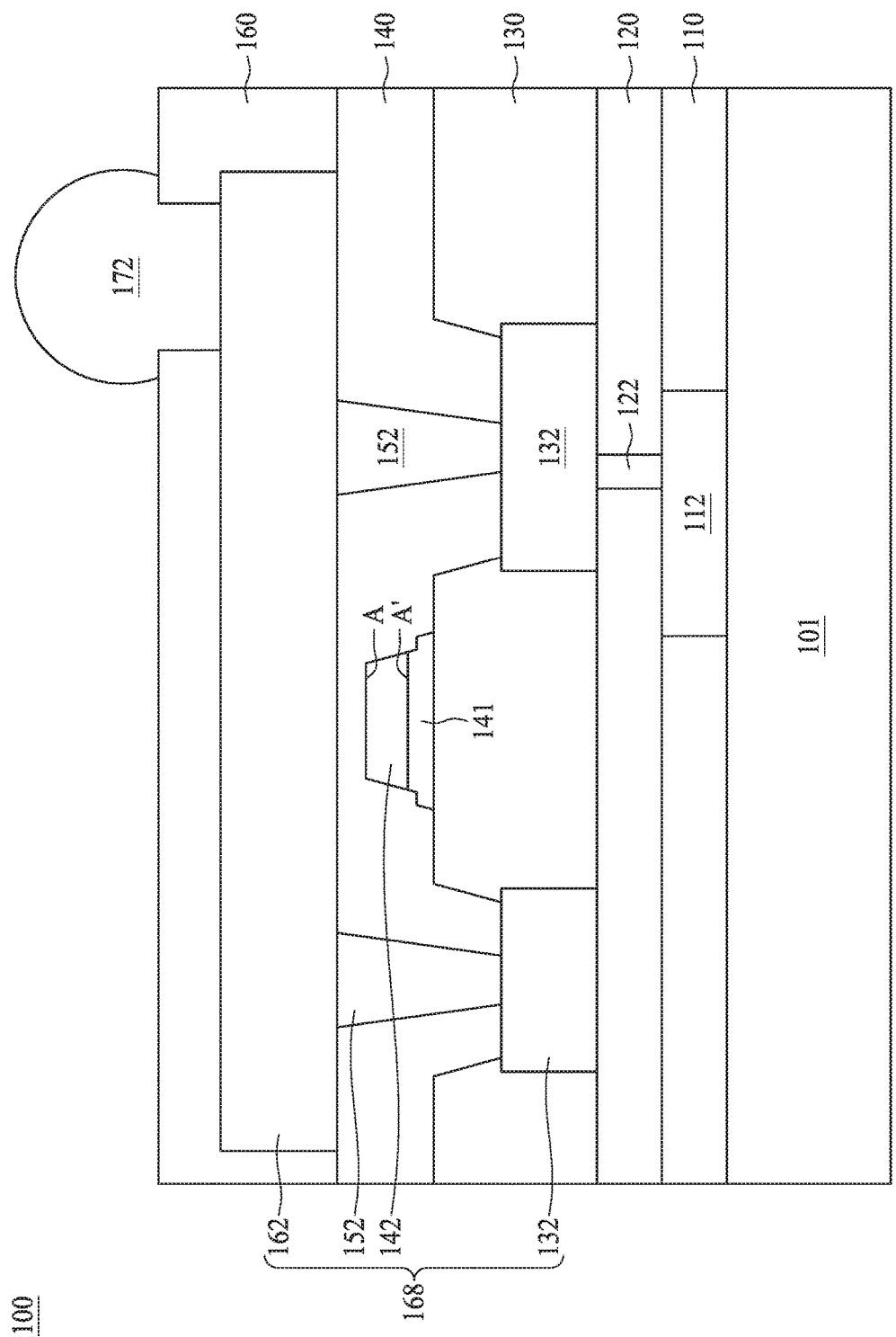
FIG. 1 illustrates a cross-sectional view of a semiconductor device having an integrated inductor formed in passivation layers during the Back-End-Of-Line (BEOL) processing of semiconductor manufacturing process in accordance with an embodiment of the present disclosure.

The following disclosure provides many different embodiments, or examples, for implementing different features of the provided subject matter. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals or letters in the various examples. This repetition is for the purpose of simplicity and clarity and does not in itself dictate a relationship between the various embodiments and configurations discussed.

Further, spatially relative terms, such as "beneath," "below," "lower," "above," "upper" and the like, may be used herein for ease of description to describe one element or feature's relationship to another element or feature as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

Notwithstanding that the numerical ranges and parameters setting forth the broad scope of the disclosure are approximations, the numerical values set forth in the specific examples are reported as precisely as possible. Any numerical value, however, inherently contains certain errors necessarily resulting from the standard deviation found in the respective testing measurements. Also, as used herein, the term "about" generally means within 10%, 5%, 1%, or 0.5% of a given value or range. Alternatively, the term "about" means within an acceptable standard error of the mean when considered by one of ordinary skill in the art. Other than in the operating or working examples, or unless otherwise expressly specified, all of the numerical ranges, amounts, values and percentages such as those for quantities of materials, durations of times, temperatures, operating conditions, ratios of amounts, and the likes thereof disclosed herein should be understood as modified in all instances by the term "about." Accordingly, unless indicated to the contrary, the numerical parameters set forth in the present disclosure and attached claims are approximations that can vary as desired. At the very least, each numerical parameter should at least be construed in light of the number of reported significant digits and by applying ordinary rounding techniques. Ranges can be expressed herein as from one endpoint to another endpoint or between two endpoints. All ranges disclosed herein are inclusive of the endpoints, unless specified otherwise.

The embodiments will be described with respect to embodiments in a specific context, namely an integrated inductor with a magnetic core. The embodiments may also be applied, however, to other integrated components.

FIG. 1 illustrates a cross-sectional view of a semiconductor device 100 having an integrated inductor formed in passivation layers during the Back-End-Of-Line (BEOL) processing of semiconductor manufacturing process in accordance with an embodiment of the present disclosure. As shown in FIG. 1, an integrated inductor 168 includes a plurality of coils or windings that are concatenated and formed around a magnetic core 142. The magnetic core 142 has an upper surface A and a lower surface A'. The surfaces A and A' are parallel to a substrate 101. Each of the plurality of coils may include an upper portion 162 (hereafter upper coil segment 162) and a lower portion 132 (hereafter lower coil segment 132). In some embodiments, the lower coil segment 132 is formed in a passivation layer 130 below the magnetic core 142, and the upper coil segment 162 is formed in another passivation layer 160 above the magnetic core 142, and vias 152 connect the upper coil segment 162 with the lower coil segment 132.

The integrated inductor 168 may connect to conductive traces and conductive pads, which may further connect to other conductive features of the semiconductor device 100 to perform specific functions of the design. Although not shown in FIG. 1, the integrated inductor may be connected through, e.g., vias to other conductive features formed in various layers of the semiconductor device 100, in some embodiments.

The integrated inductor 168, which includes the lower coil segment 132, the vias 152, the upper coil segment 162 and the magnetic core 142, is formed in a plurality of passivation layers over semiconductor substrate 101. Note that depending on the specific design for the upper coil segment 162 and the lower coil segment 132, the upper coil segment 162 or the lower coil segment 132 may not be visible in a cross-sectional view, in some embodiments. In other embodiments, at least a portion of the upper coil segment 162 or/and at least a portion of the lower coil segment 132 may not be visible in a cross-sectional view. To simplify illustration, both the upper coils segments 162 and the lower coil segment 132 are shown as visible in all cross-sectional views in the present disclosure without intent to limit. One of ordinary skill in the art will appreciate that the embodiments illustrated in the present disclosure can be easily applied to various designs for the upper coils segments 162 and the lower coil segment 132 without departing from the spirit and scope of the present disclosure.

The semiconductor substrate 101 may include bulk silicon, doped or undoped, or an active layer of a silicon-on-insulator (SOI substrate. Generally, an SOL substrate includes a layer of a semiconductor material such as silicon, germanium, silicon germanium, SOI, silicon germanium on insulator (SGOI), or combinations thereof. Other substrates that may be used include multi-layered substrates, gradient substrates, or hybrid orientation substrates.

The semiconductor substrate 101 may include active de not shown FIG. 1 for conciseness). As one of ordinary skill in the art will recognize, a wide variety of active devices such as transistors, capacitors, resistors, combinations of these, and the like may be used to generate the desired structural and functional requirements of the design for the semiconductor device 100. The active devices may be formed using any suitable methods.

The semiconductor substrate 101 may also include metallization layers (also not shown in FIG. 1 for conciseness). The metallization layers may be formed over the active devices and are designed to connect the various active devices to form functional circuitry. The metallization layers (not shown) may be formed of alternating layers of dielectric (e.g., low-k dielectric material) and conductive material (e.g., copper) and may be formed through any suitable process (such as deposition, damascene, dual damascene, etc,).

As illustrated in FIG. 1, passivation layers (e.g., a first passivation layer 110, a second passivation layer 120, the third passivation layer 130, a fourth passivation layer 140 and the fifth passivation layer 160) are formed consecutively over the substrate 101, in some embodiments. The first passivation layer 110 may be disposed over the substrate 101, and post-passivation interconnect (PPI) 112 may be formed in the first passivation layer 110. The PPI may be connected to metal layers in the substrate 101 or other layers of the semiconductor device 100 by vias (not shown), in some embodiments. The PPI may be connected to the lower coil segment 132 formed in the third passivation layer 130 by the vias 122, which are formed in the second passivation layer 120, in some embodiments. The magnetic core 142 is formed in the fourth passivation layer 140 and is surrounded by and insulated from the lower coil segment 132, the upper coil segment 162, and the vias 152. The magnetic core 142 has a trapezoidal cross-section. However, this is not a limitation of the present disclosure. In some embodiments, the magnetic core 142 may have a rectangular cross-section.

A lower surface A' of the magnetic core 142 overlies the third passivation layer 130, wherein an etch stop layer 141 is located between the lower surface A' of the magnetic core 142 and the third passivation layer 130. A fifth passivation layer 160 is formed over the fourth passivation layer 140 and the magnetic core 142. The upper coil segment 162 is formed in the fifth passivation layer 160. The vias 152 extend through the fourth passivation layer 140 to connect the upper coil segment 162 with the lower coil segment 132. Solder balls 172 may be formed on the fifth passivation layer 160 for external connections.

The embodiment in FIG. 1 shows five passivation layers, however, one of ordinary skill in the art will appreciate that more or less than five passivation layers may be formed without departing from the spirit and scope of the present disclosure. For example, there may be more passivation layers over the upper coil segment 162, and there could be more or less passivation layers under lower coil segment 132 than those illustrated in FIG. 1. In addition, other features such as contact pads, conductive traces, and external connectors may be formed in/on the semiconductor device 100, but are not shown in FIG. 1 for conciseness.

Figure 2A:
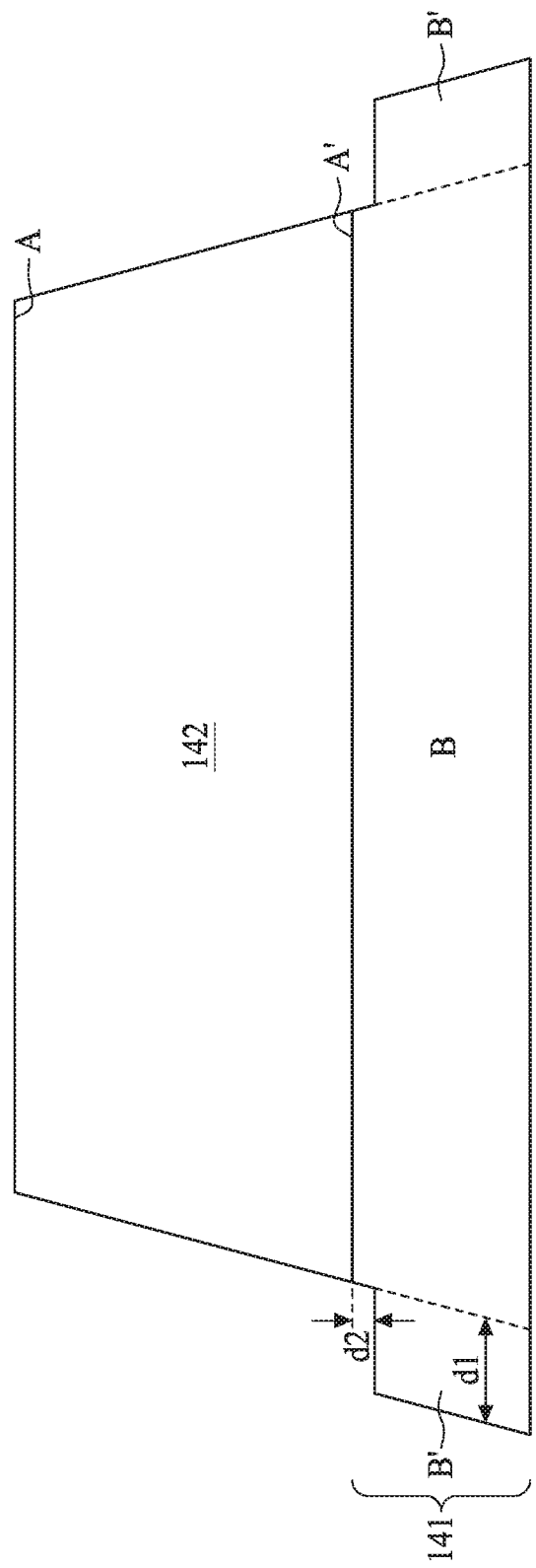
FIG. 2A-FIG. 2C illustrate cross-sectional views of the magnetic core 142 and the etch stop layer 141 in accordance with some embodiments of the present disclosure.
Figure 2B:
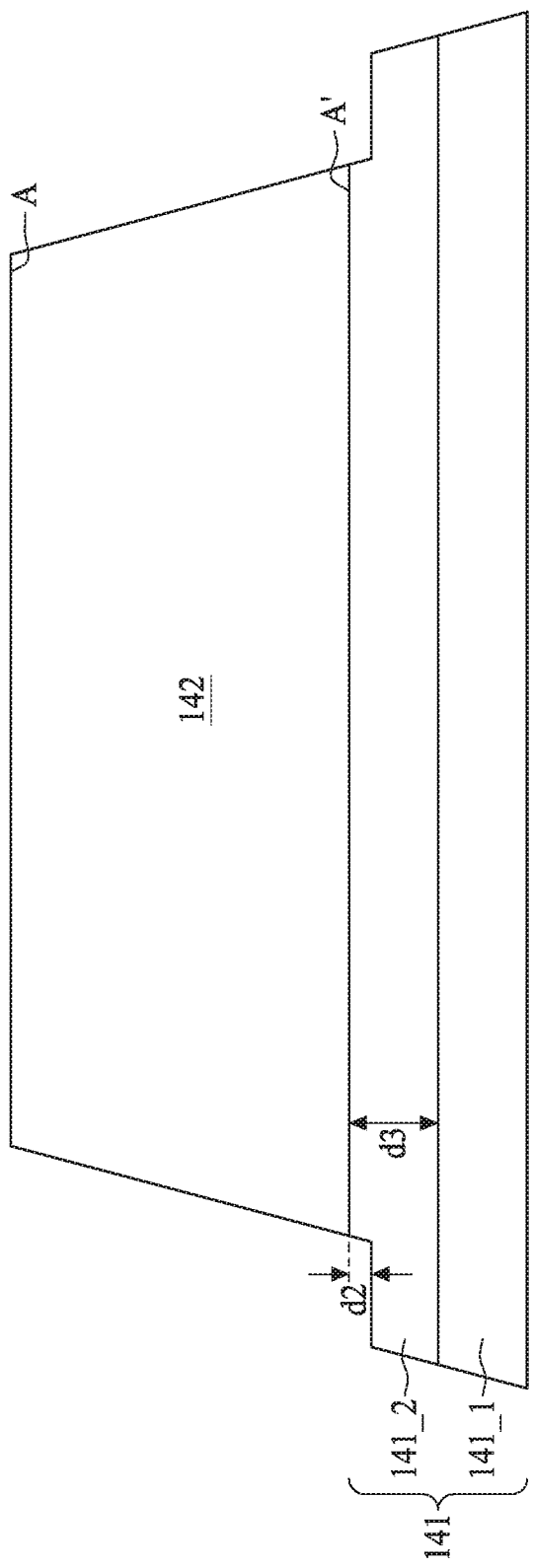
Figure 2C:
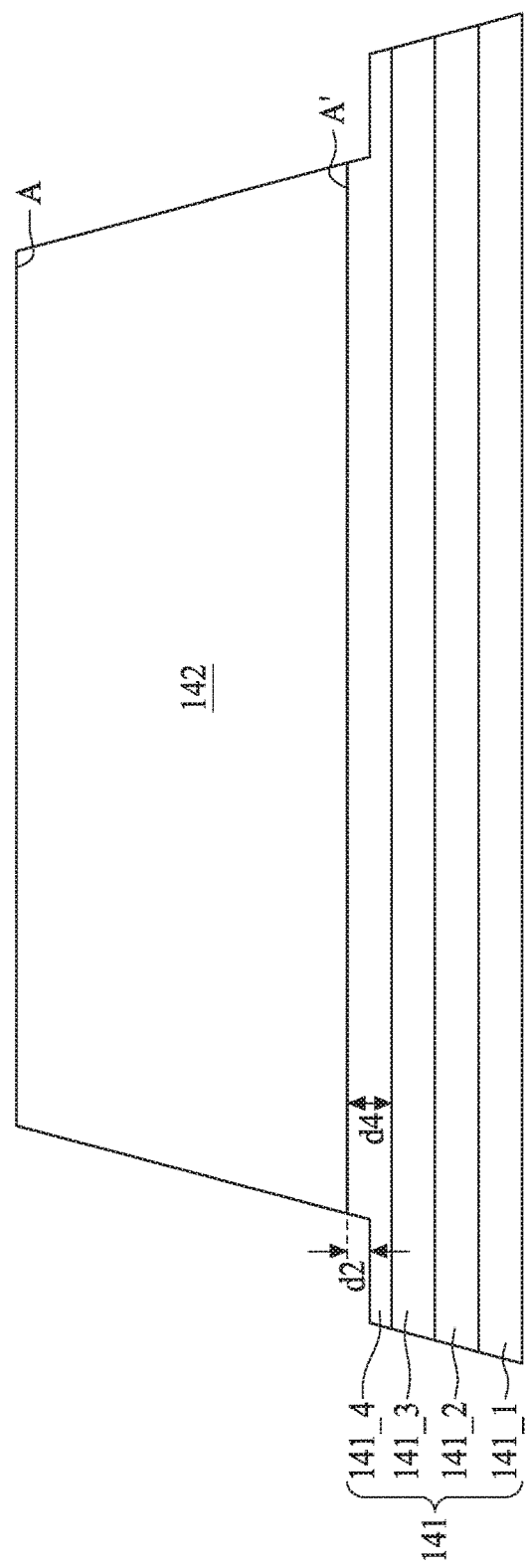

FIG. 2A-FIG. 2C illustrate cross-sectional views of the magnetic core 142 and the etch stop layer 141 in accordance with some embodiments of the present disclosure. In FIG. 2A, a first type of the etch stop layer 141 is disclosed. The etch stop layer 141 is formed around the lower surface A' of the magnetic core 142. The etch stop layer 141 includes an acid resistant layer which is acid resistant against a wet etching agent used to chemically etch the magnetic core 142. Edge portions B' extend from a central portion B of the etch stop layer 141 by a first distance d1. An upper surface of the edge portions B' is lower than an upper surface of the central portion B of the etch stop layer 141 (i.e. the lower surface A' of the magnetic core 142) by a second distance d2. However, this is not a limitation of the present disclosure. In some embodiments, the edge portions B' may not extend from the central portion B of the etch stop layer 141. For example, the first distance d1 equals 0. In some embodiments, the upper surface of the edge portions B' may not lower than the upper surface of the central portion B of the etch stop layer 141. For example, the second distance d2 equals 0.

In FIG. 2B, a second type of the etch stop layer 141 is disclosed. The etch stop layer 141 includes an acid resistant layer 141_2 acting in the same way as the acid resistant layer of FIG. 2A. The etch stop layer 141 of FIG. 2B further includes a stress buffer layer 141_1 acting as a stress buffer to reduce stress induced around an interface between the acid resistant layer 141_2 and the third passivation layer 130 underlying the acid resistant layer 141_2. Sidewalls of the stress buffer layer 141_1 align with sidewalls of the acid resistant layer 141_2. In FIG. 2B, the second distance d2 is shorter than a distance d3 between of the lower surface A' of the magnetic core 142 and a lower surface of the acid resistant layer 141_2. The distance d3 may be the same to a thickness of the stress buffer layer 141_1. However, this is not a limitation of the present disclosure. In some embodiments, the distance d3 may be thicker or thinner than the thickness of the stress buffer layer 141_1.

In FIG. 2C, a third type of the etch stop layer 141 is disclosed. The etch stop layer 141 includes two stress buffer layers 141_1 and 141_3 acting in the same way as the stress buffer layers 141_1 of FIG. 2B, and two acid resistant layers 141_2 and 141_4 acting in the same way as the acid resistant layer of FIG. 2A and FIG. 2B. In other words, two sets of the stress buffer layer and the acid resistant layer are orderly stacked under the magnetic core 142 in a repeating manner with the stress buffer layer and the acid resistant layer being interlaced. However, this is not a limitation of the present disclosure. In some embodiments, more than two sets of the stress buffer layer and the acid resistant layer may be formed under the the magnetic core 142. In FIG. 2C, the second distance d2 is shorter than a distance d4 between of the lower surface A' of the magnetic core 142 and a lower surface of the acid resistant layer 141_4. The distance d3 may be the same to a thickness of the stress buffer layer 141_3, the acid resistant layer 141_2 and the stress buffer layers 141_1. However, this is not a limitation of the present disclosure.

Figure 3:
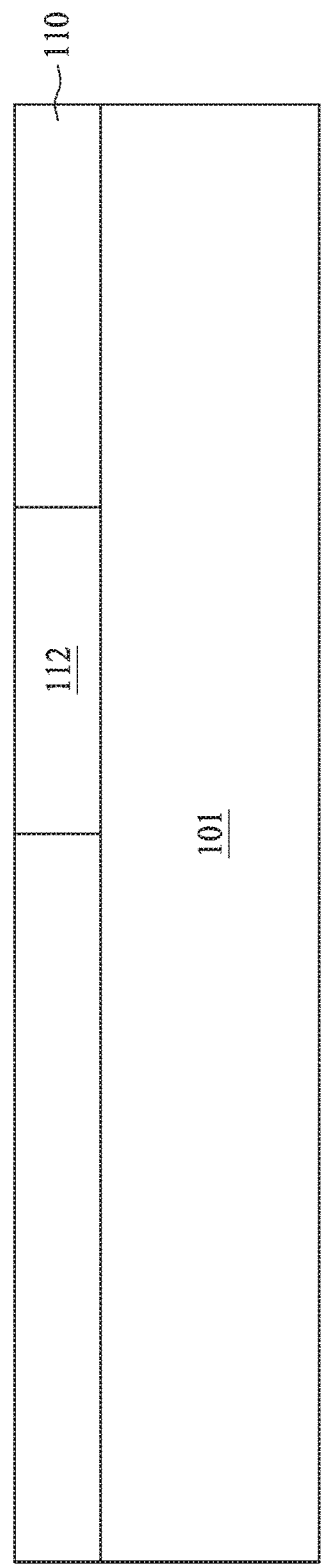
FIG. 3-FIG. 18 illustrate cross-sectional views of the semiconductor device 100 at various stages of fabrication according to embodiments of the present disclosure.

FIG. 3-FIG. 18 illustrate cross-sectional views of the semiconductor device 100 at various stages of fabrication according to embodiments of the present disclosure. As illustrated in FIG. 3, the first passivation layer 110 may be formed on the semiconductor substrate 101. The first passivation layer 112 may be made of polymers, such as polybenzoxazole (PBC)), polyimide, or benzocyclobutene, in some embodiments, or silicon dioxide, silicon nitride, silicon oxynitride, tantalum pentoxide, or aluminum oxide, in some other embodiments. The first passivation layer 112 may be formed through a process such as chemical vapor deposition (CVD), although any suitable process may be utilized. The first passivation layer 112 may have a thickness between about 0.5 urn and about 5 μm, however, other ranges of thickness are also possible, depending on the designs and requirements of the semiconductor device 100.

The post-passivation interconnect (PPI) 112 may be formed over the semiconductor substrate 101 and within the first passivation layer 110 to provide an electrical connection between the integrated inductor 168 and other circuits of the semiconductor device 100, in some embodiments. For example, the PPI 112 may be connected to metal layers (not shown) in the substrate 101. The PPI 112 may be comprised of copper, but other materials, such as aluminum, may alternatively be used. An opening through the first passivation layer 112 may be made in the desired location of PPI 112 through a suitable process, such as a suitable photolithographic masking and etching. For example, a photoresist (not shown) may be formed on the first passivation layer 110 and may then be patterned in order to provide an opening in the first passivation layer 110. The patterning may be performed by exposing the photoresist to a radiation such as light in order to activate photoactive chemicals that may make up one component of the photoresist. A positive developer or a negative developer may then be used to remove either the exposed or unexposed photoresist depending on whether positive or negative photoresist is used.

Once the photoresist has been developed and patterned, PPI 112 may be constructed by using the photoresist as a mask to form the opening into or through the first passivation layer 110 using, e.g., an etching process. The conductive material may then be formed into the opening into or through the first passivation layer 110, e.g., by first applying a seed layer (not shown) into and along the sidewalls of the opening. The seed layer may then be utilized in an electroplating process in order to plate the conductive material into the opening into or through the first passivation layer 110, thereby forming the first interconnect 112. However, while the material and methods discussed are suitable to form the conductive material, these materials are merely exemplary. Any other suitable materials, such as tungsten, and any other suitable processes of formation, such as CVD or physical vapor deposition (PVD), may alternatively be used to form the PPI 112.

Figure 4:
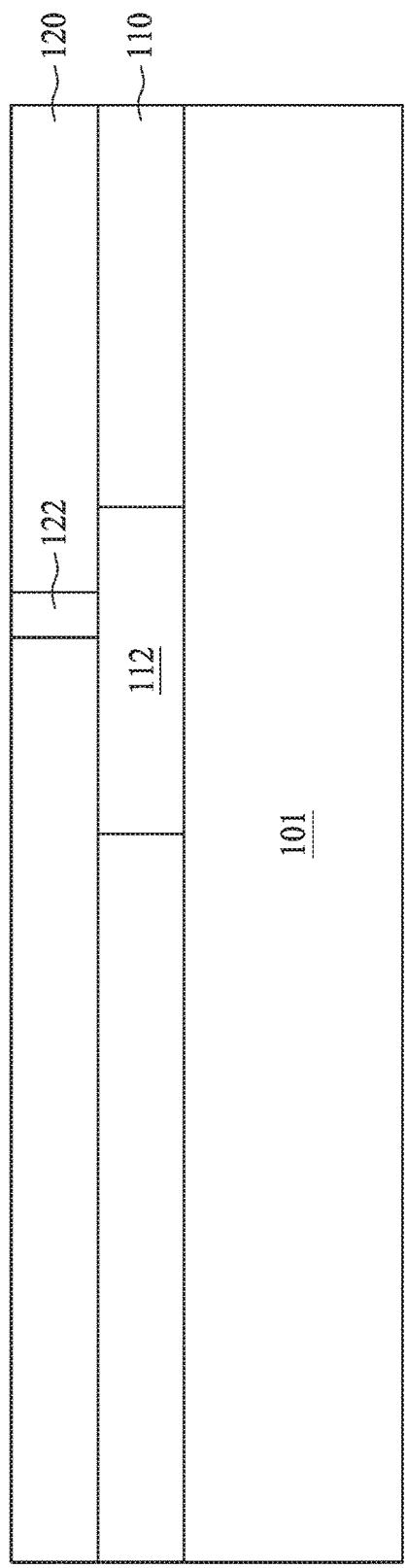

A second passivation layer 120 may be formed over the first passivation layer 110, as illustrated in FIG. 4. In some embodiments, the second passivation layer 120 may be comprised of the same material as the first passivation layer 110. Alternatively, the second passivation layer 120 may include other suitable dielectric materials different from the materials in the first passivation layer 110. Deposition process such as CVD, PVD, combinations thereof, or any other suitable processes of formation, can be used to form the second passivation layer 120. The second passivation layer 120 may have a thickness between about 0.5 μm and about 5 μm, however, other ranges of thickness are also possible, depending on the designs and requirements of the semiconductor device 100.

Vias 122 may be formed in the second passivation layer 120 to provide a conductive path between the PPI 112 in the first passivation layer 110 and the integrated inductor 168 formed in subsequent processing. The vias 122 may include copper, but other materials, such as aluminum or tungsten, may alternatively be used. The vias 122 may be formed, e.g., by forming openings for the vias 122 through the second passivation layer 120 using, e.g., a suitable photolithographic mask and etching process. After the openings for vias 122 have been formed, vias 112 may be formed using a seed layer (not shown) and a plating process, such as electrochemical plating, although other processes of formation, such as sputtering, evaporation, or plasma-enhanced CVD (PECVD) process, may alternatively be used depending upon the desired materials. Once the openings for vias 112 have been filled with conductive material, any excess conductive material outside of the openings for the vias 112 may be removed, and the vias 112 and the second passivation layer 120 may be planarized using, for example, a chemical mechanical polishing (CMP) process.

Figure 5:
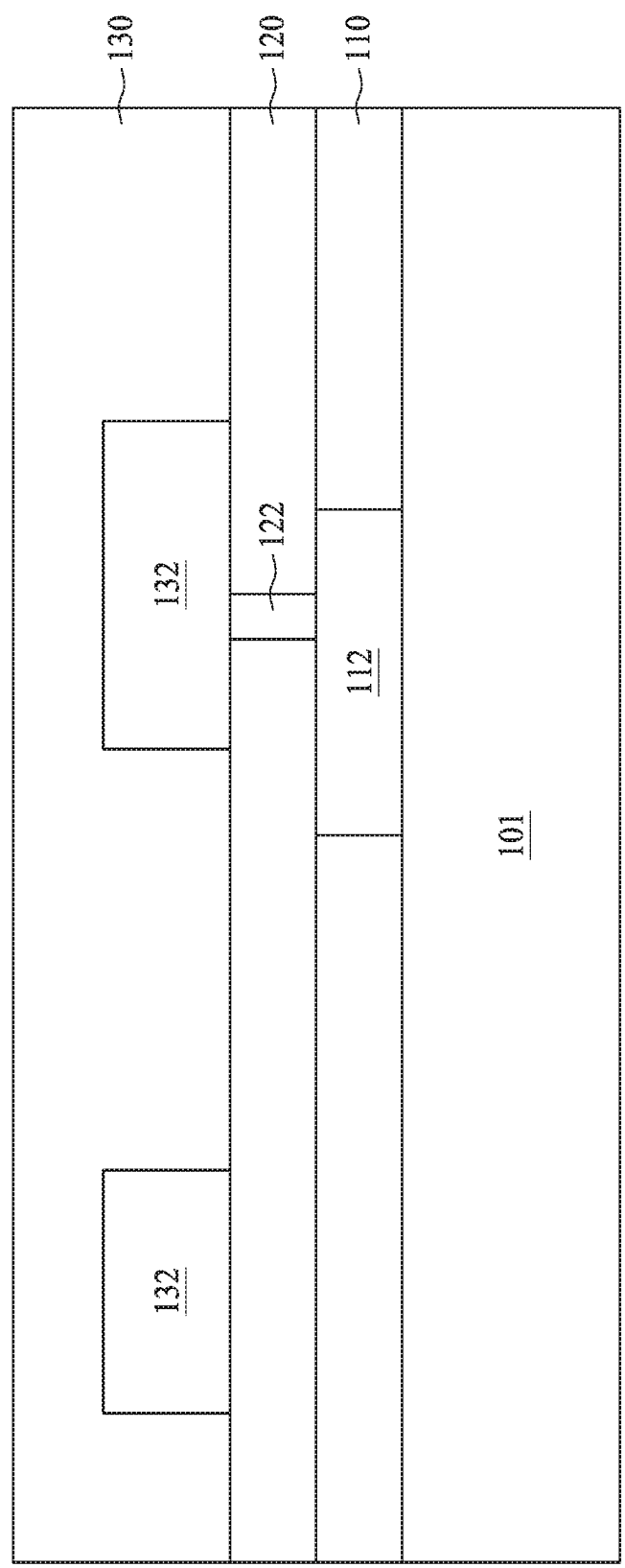

As illustrated in FIG. 5, the lower coil segment 132 is formed over the second passivation layer 120. In accordance with some embodiments, the lower coil segment 132 may include copper. In one embodiment, the lower coil segment 132 has a thickness in a range between about 5 um and about 20 um. The above thickness range is merely an example, the dimensions of the integrated inductor 168 (e.g., the lower coil segment 132, the upper coil segment 162, the vias 152 and the magnetic core 142) are determined by various factors such as the functional requirements for the integrated inductor 168 and process technologies, thus other dimensions for the integrated inductor 168 are possible and are fully intended to be included within the scope of the current disclosure.

Next, a third passivation layer 130 may be formed over the second passivation layer 120 and the lower coil segment 132. The third passivation layer 130 may be comprised of the same material as the first passivation layer 110 and may be formed by CVD, PVD, or any other suitable processes of formation, in some embodiments. Alternatively, the third passivation layer 130 may include other suitable materials different from the dielectric materials in the first passivation layer 110. The thickness of the third passivation layer 130 may be larger than the thickness of the lower coil segment 132 so that the lower coil segment 132 is encapsulated in the third passivation layer 130. The third passivation layer 112 may have a thickness between about 5 μm and about 20 μm, however, other ranges of thickness are also possible, depending on the designs and requirements of the semiconductor device 100.

Figure 6:
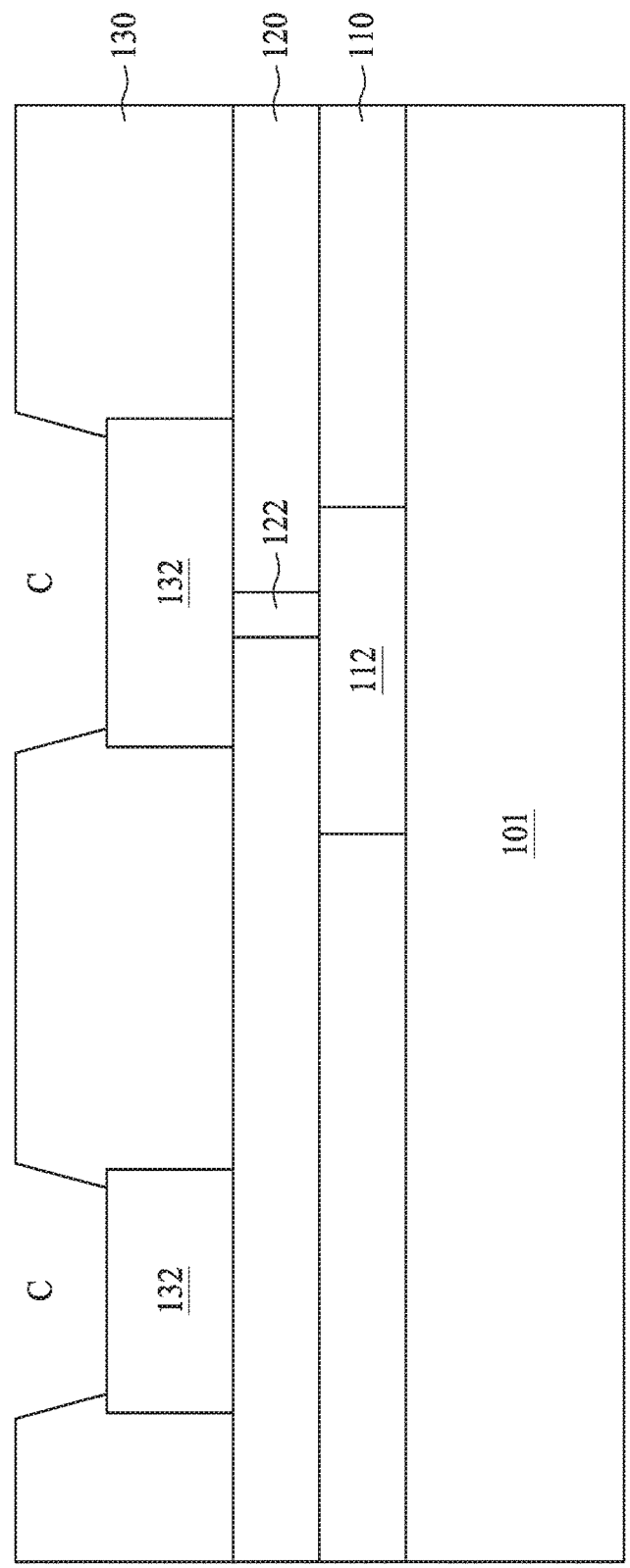
Figure 7:
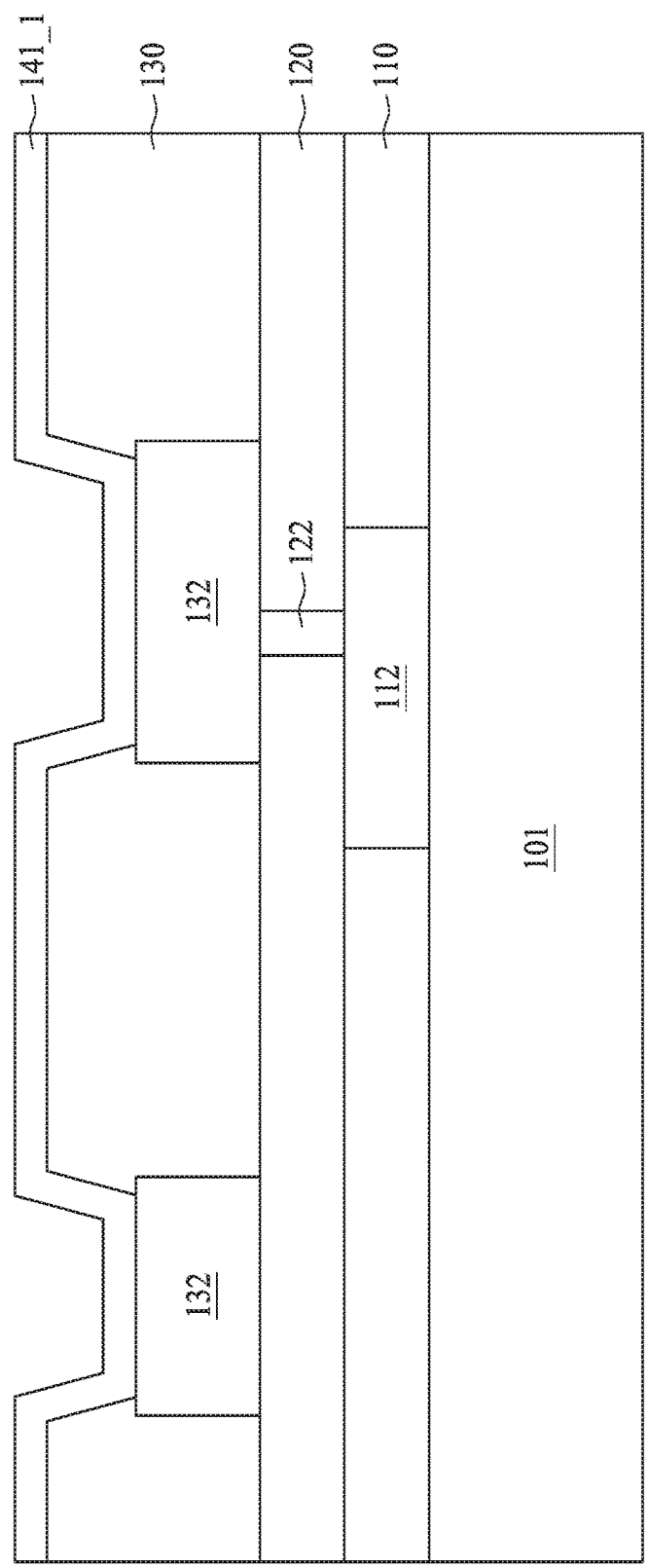
Figure 8:
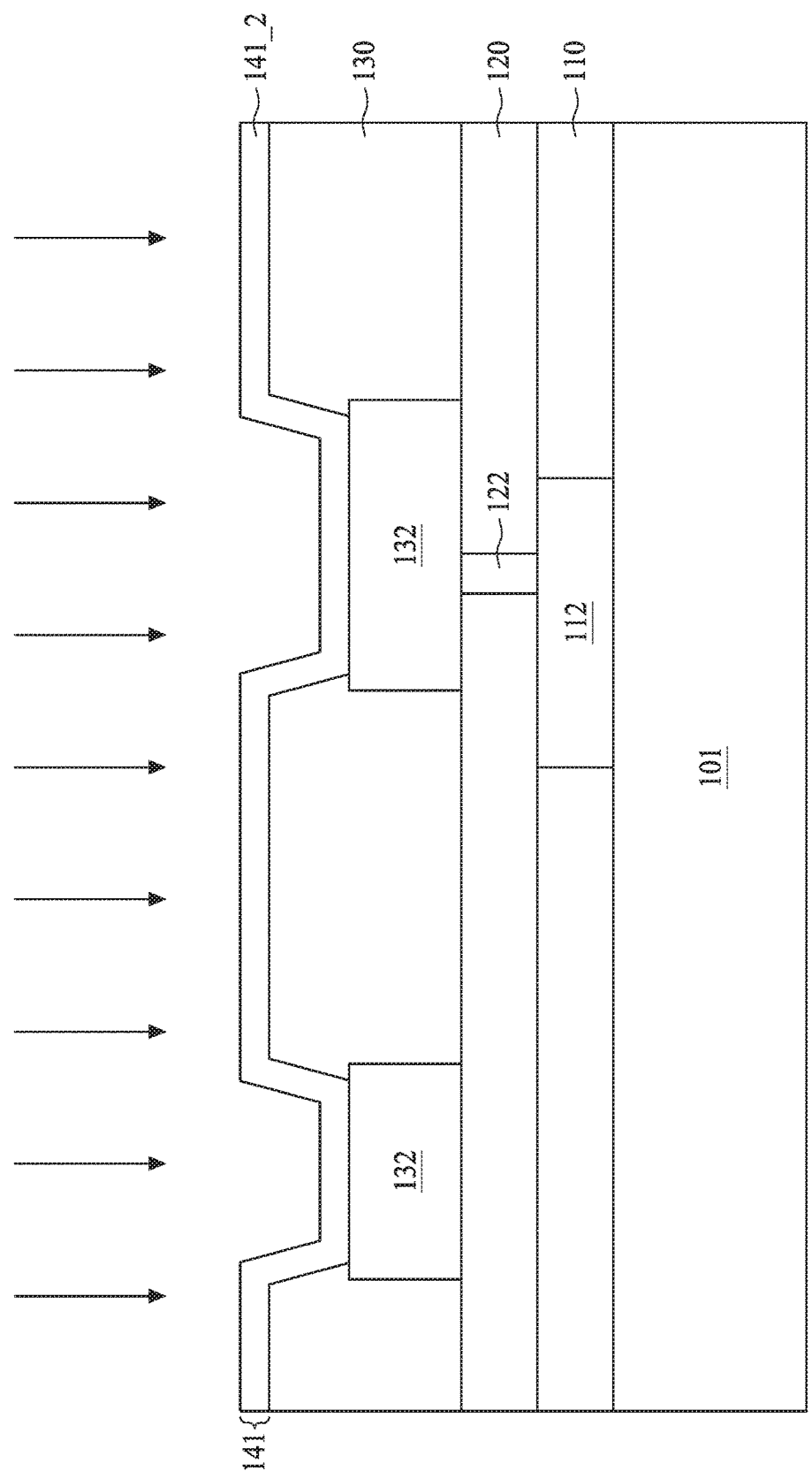
Figure 9:
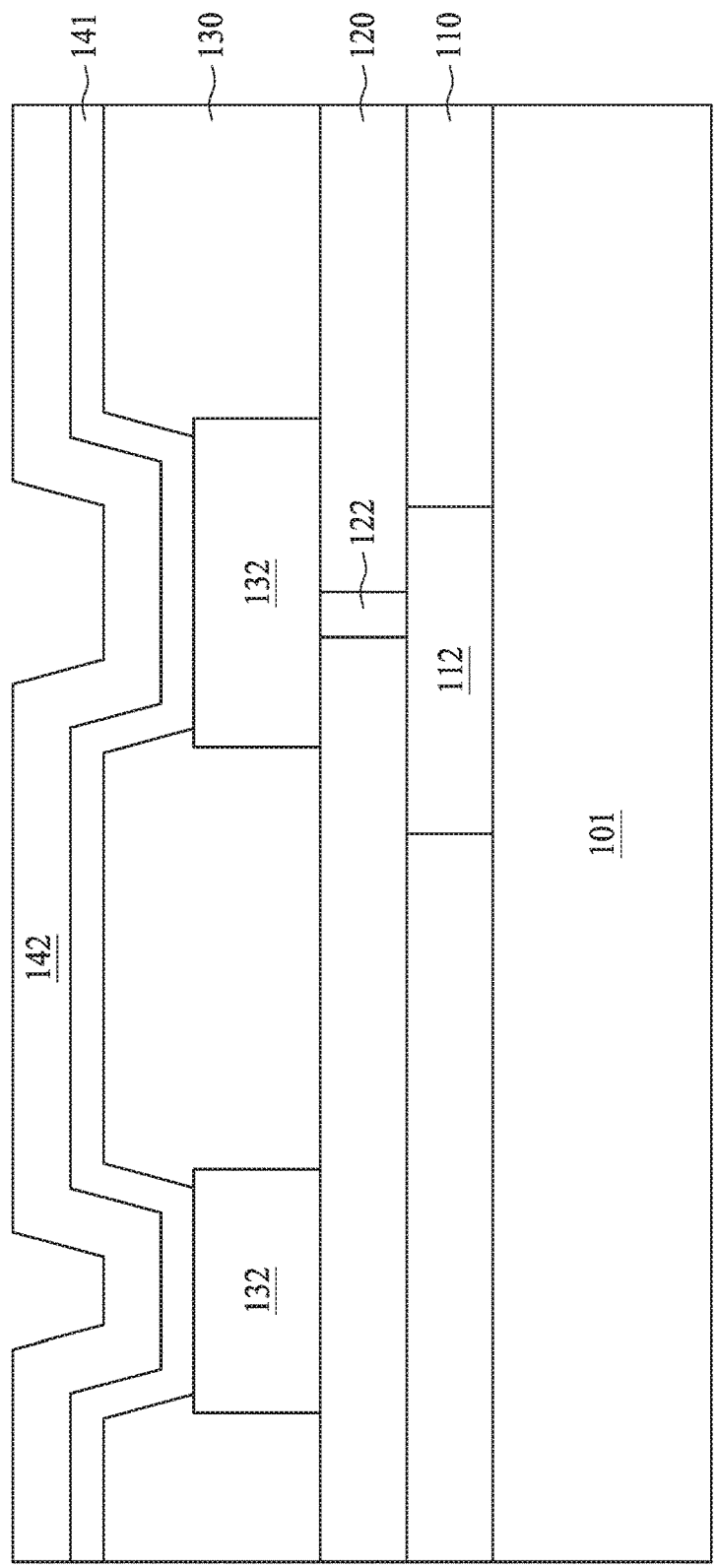

Referring next to FIG. 6, an etching process is performed to remove an upper portion of the third passivation layer 130 to expose an upper surface of the lower coil segment 132, in some embodiments. As a result of the etching process, openings C extend into the third passivation layer 130. The etching process is controlled to stop when reaching the lower coil segment 132. Sidewalk of the openings C may be sloped. However, in some embodiments of the present disclosure, the openings C may have straight sidewalls Next, FIG. 7 to FIG. 8 illustrate the formation of the first type of the etch stop layer 141 according to an embodiment of the present disclosure. In FIG. 7, a layer of the stress buffer layer 141_1 is blanket deposited over the third passivation layer 130 and the lower coil segment 132. The stress buffer layer 141_1 may be made of one or more suitable materials such as tantalum (Ta), titanium (Ti), or the like. A thickness of the stress buffer layer 141_1 may be about 50 angstroms to about 300 angstroms, however, other ranges of thickness are also possible, depending on the designs and requirements of the semiconductor device 100. In FIG. 8, the acid resistant layer 141_2 is obtained through an oxygen treatment performed upon the stress buffer layer 141_1. In the embodiment, i.e., for the first type of the etch stop layer 141, the layer 141_1 of Ta or Ti fully reacts with oxygen and completely turns into the layer 141_2 of TaO or TiO. In other words, the etch stop layer 141 only includes the acid resistant layer 141_2. In some embodiments, formation of the first type of the etch stop layer 141 may be directly blanket depositing the acid resistant layer 141_2 of TaO or TiO over the third passivation layer 130 and the lower coil segment 132 by any suitable processes such as CVD, PVD, or combinations thereof.

Figure 14:
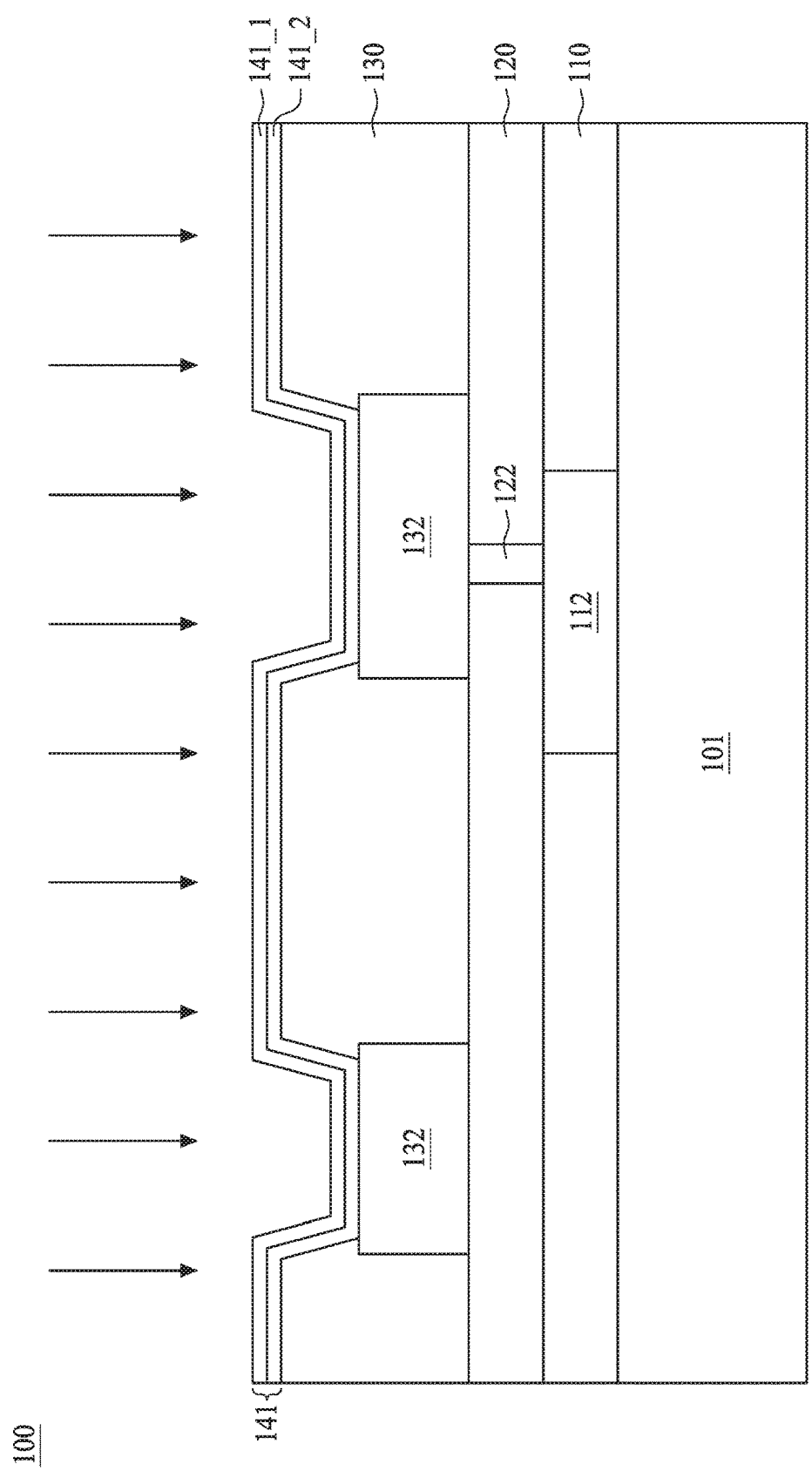
Figure 15:
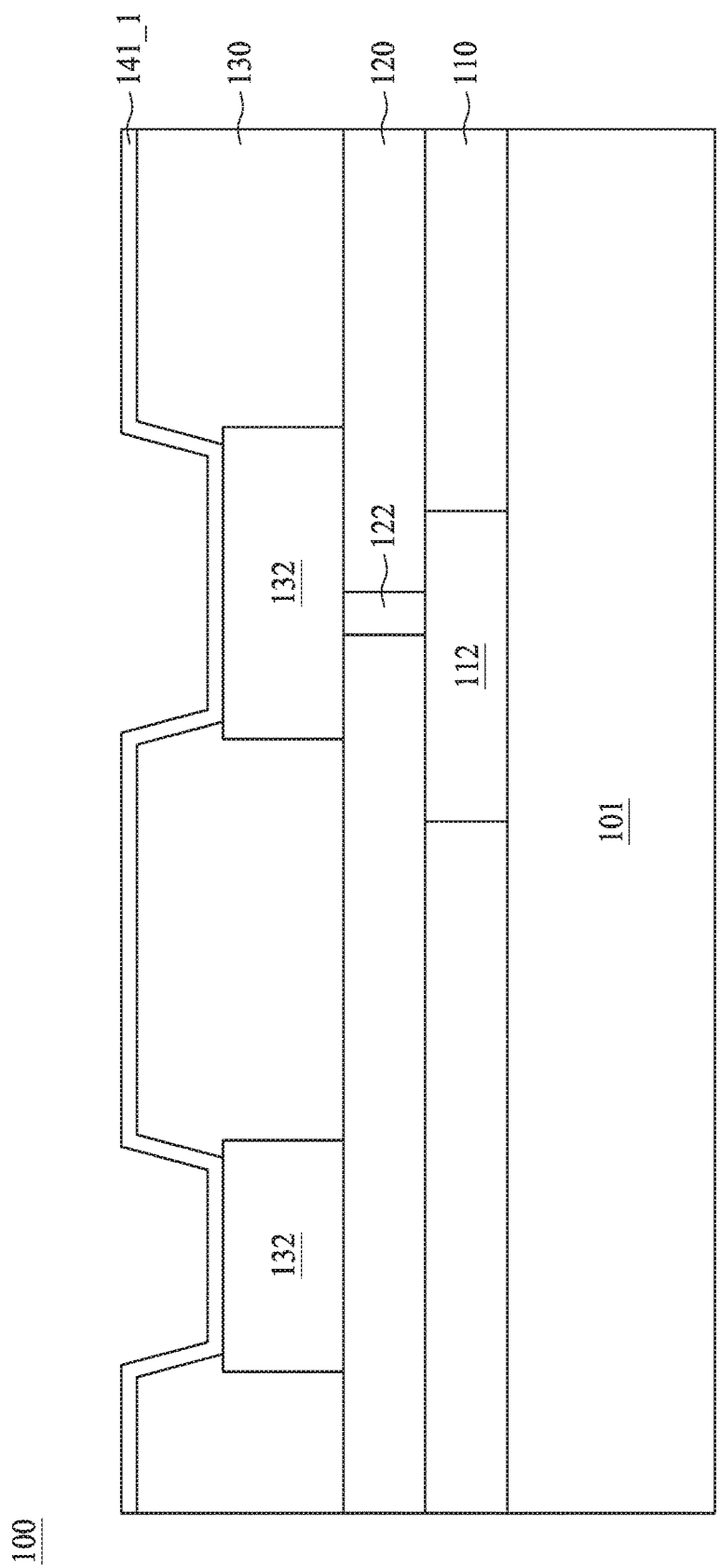
Figure 16:
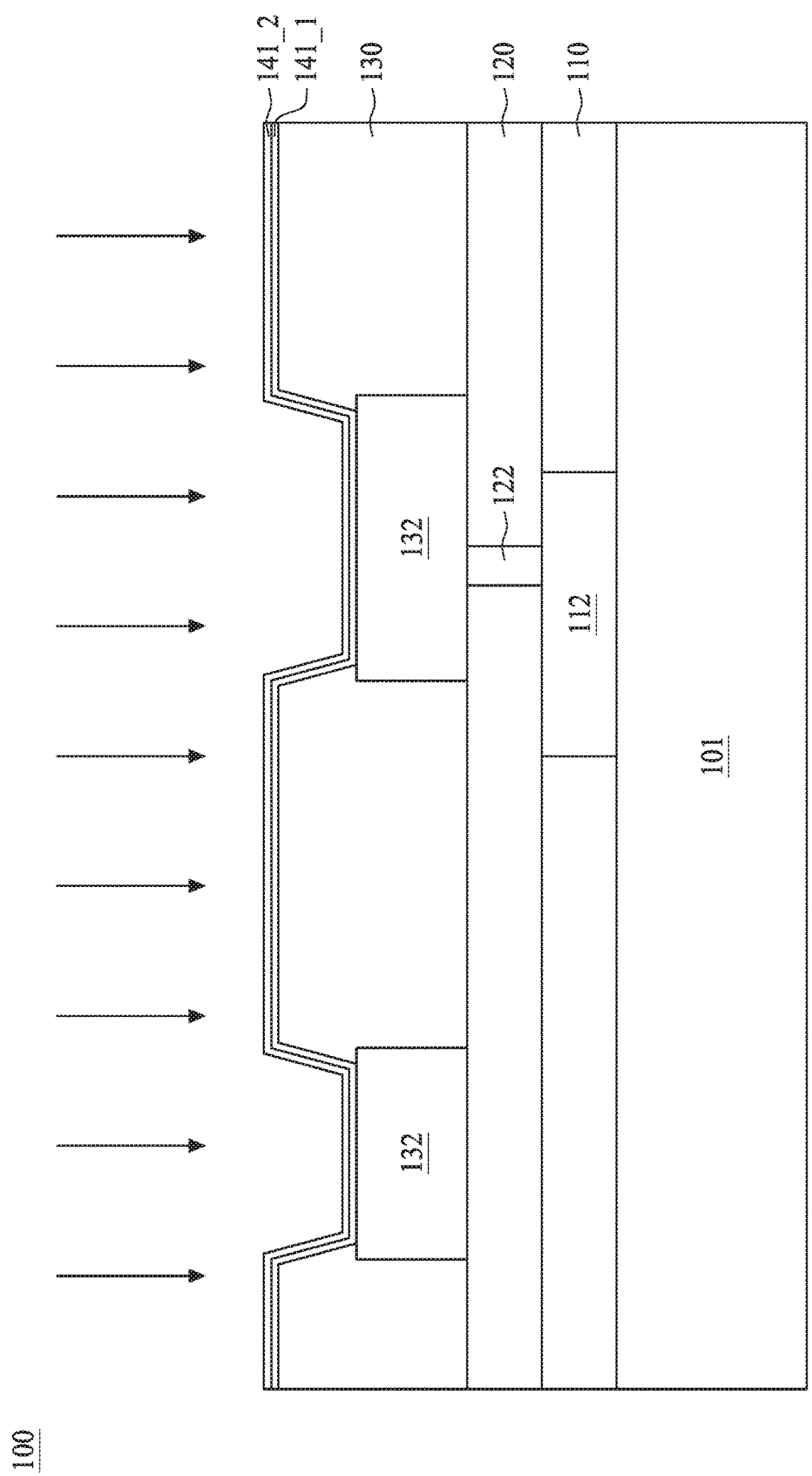
Figure 17:
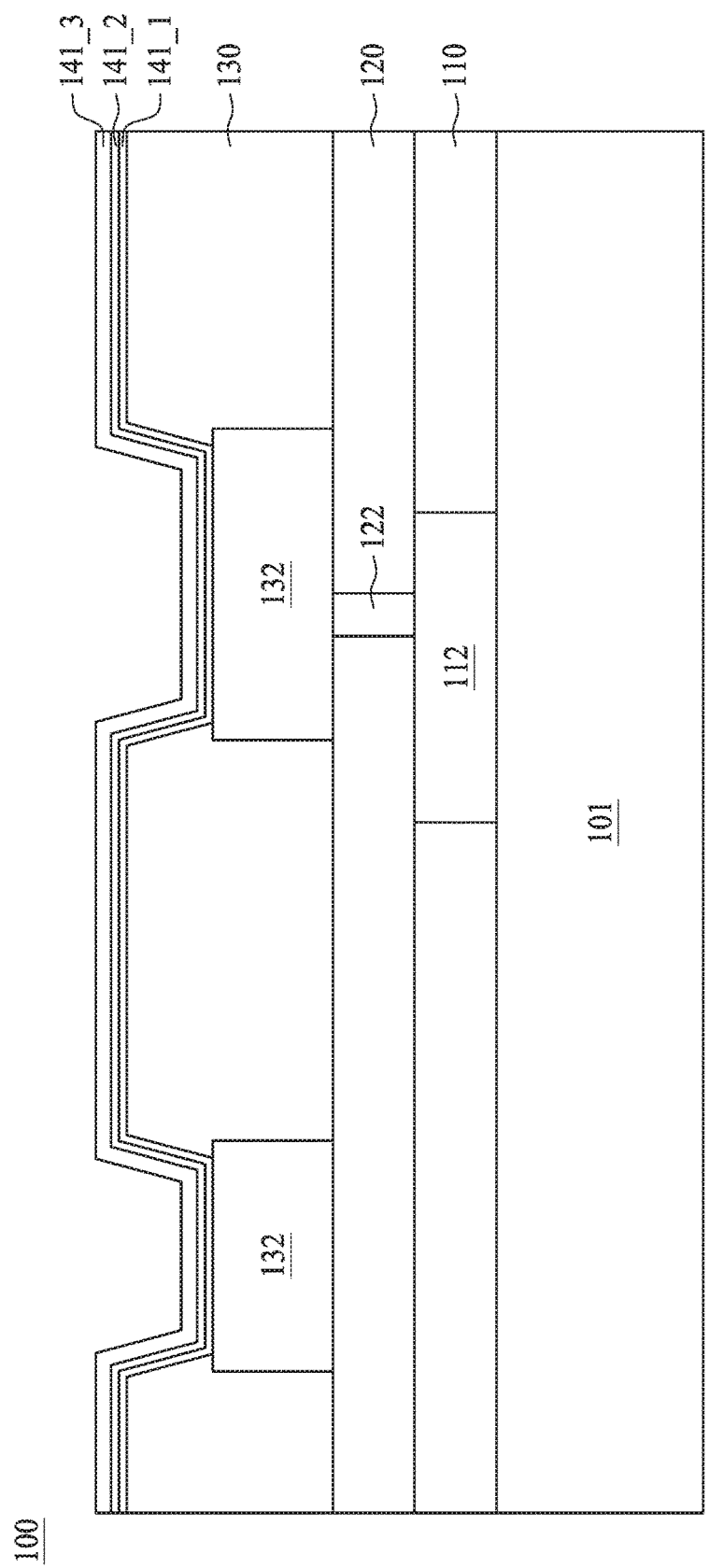
Figure 18:
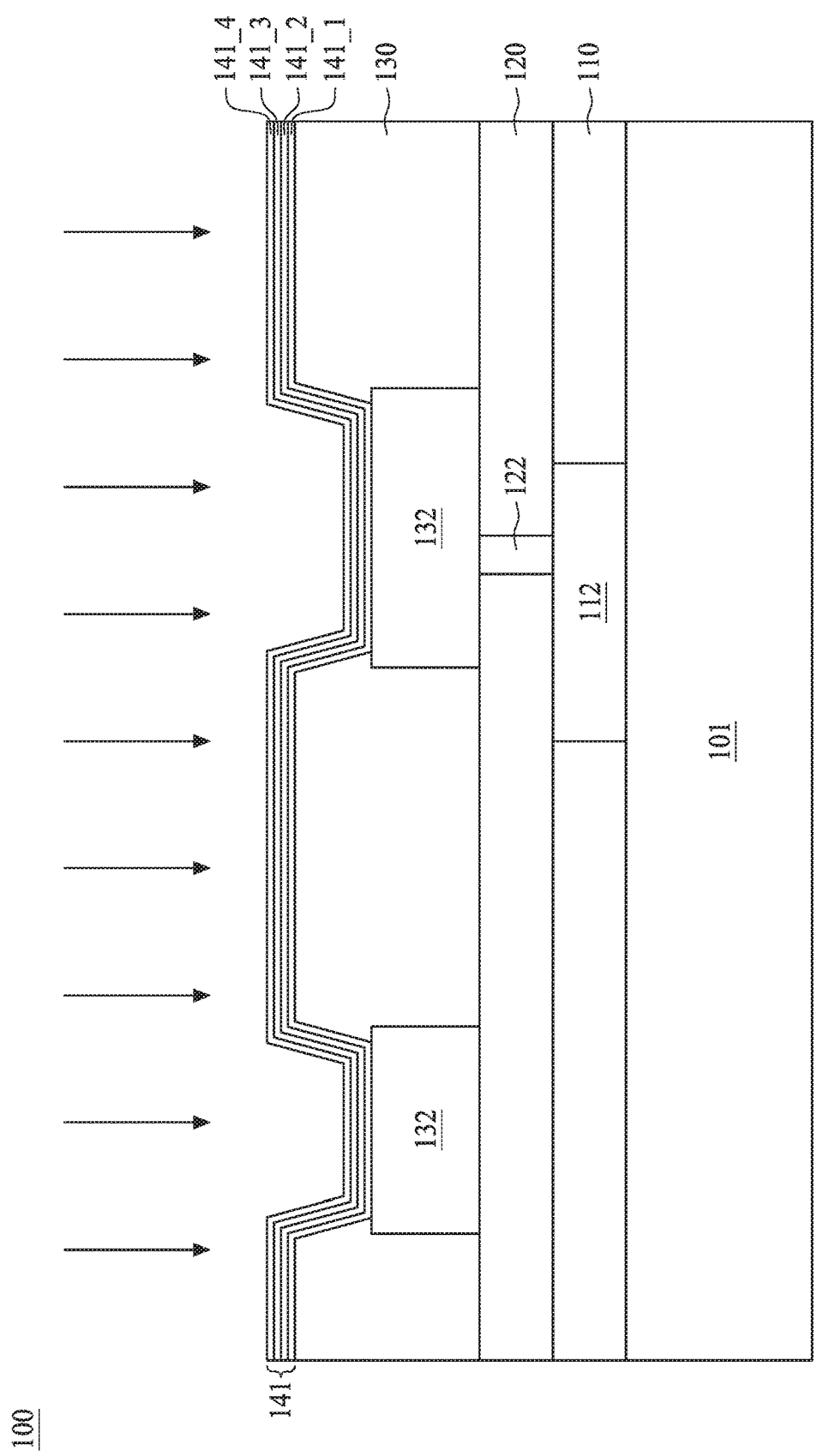

FIG. 7 and FIG. 14 illustrate the formation of the second type of the etch stop layer 141 according to an embodiment of the present disclosure. In FIG. 8, the acid resistant layer 141_2 is obtained through an oxygen treatment performed upon the stress buffer layer 141_1. In the embodiment, i.e., for the second type of the etch stop layer 141, the layer 141_1 of Ta or Ti reacts with oxygen and an upper portion of the layer 141_1 turns into the layer 141_2 of TaO or TiO. A lower portion of the layer 141_1 keeps unreacted. In other words, the etch stop layer 141 includes the acid resistant layer 141_2 and the stress buffer layer 141_1. A thickness of the stress buffer layer 141_1 may be about 50 angstroms to about 150 angstroms, and a thickness of the acid resistant layer 141_2 may be about 50 angstroms to about 250 angstroms. However, other ranges of thickness are also possible, depending on the designs and requirements of the semiconductor device 100. In some embodiments, formation of the first type of the etch stop layer 141 may be directly blanket depositing the acid resistant layer 141_2 of Tao) or TiO over the stress buffer layer 141_1.

FIG. 15 to FIG. 18 illustrate the formation of the third type of the etch stop layer 141 according to an embodiment of the present disclosure. The etch stop layer 141 of FIG. 18 includes two stress buffer layers 141_1 and 141_3 and two acid resistant layers 141_2 and 141_4. In short, the third type of the etch stop layer 141 may be obtained by by repeating a deposition and oxygen treatment process two times or cycles, where each cycle of the deposition and oxygen treatment process forms the structure as the one illustrated in FIG. 14. In some embodiments, the total thickness of the etch stop layer 141, including the stress buffer layers 141_1, the acid resistant layers 141_2, the stress buffer layers 141_3 and the acid resistant layers 141_4, may be substantially the same to the thickness of the etch stop layer 141 of the first type or the second type. However, other ranges of thickness are also possible, depending on the designs and requirements of the semiconductor device 100. In some embodiments, the third type of the etch stop layer 141 may be obtained by repeating the deposition and oxygen treatment process of FIG. 14 more than two cycles.

Referring back to FIG. 9, the magnetic material 142 is deposited over the etch stop layer 141 by a PVD, CVD, PE-CVD, combinations thereof, or any other suitable deposition process. In accordance with an embodiment, without intent of limiting, the magnetic material 142 is conformally deposited over the etch stop layer 141. In accordance with some embodiments, the magnetic material 142 includes CoxZryTaz (CZT), where x, y, and z represents the atomic percentage of cobalt (Co), zirconium (Zr), and tantalum (Ta), respectively. In some embodiments, x is in a range from about 0.85 to about 0.95, v is in a range from about 0.025 to about 0.075, and z is in a range from about 0.025 to about 0.075. In accordance with some embodiments, the magnetic core 142 has a thickness of about 5 urn.

Figure 10:
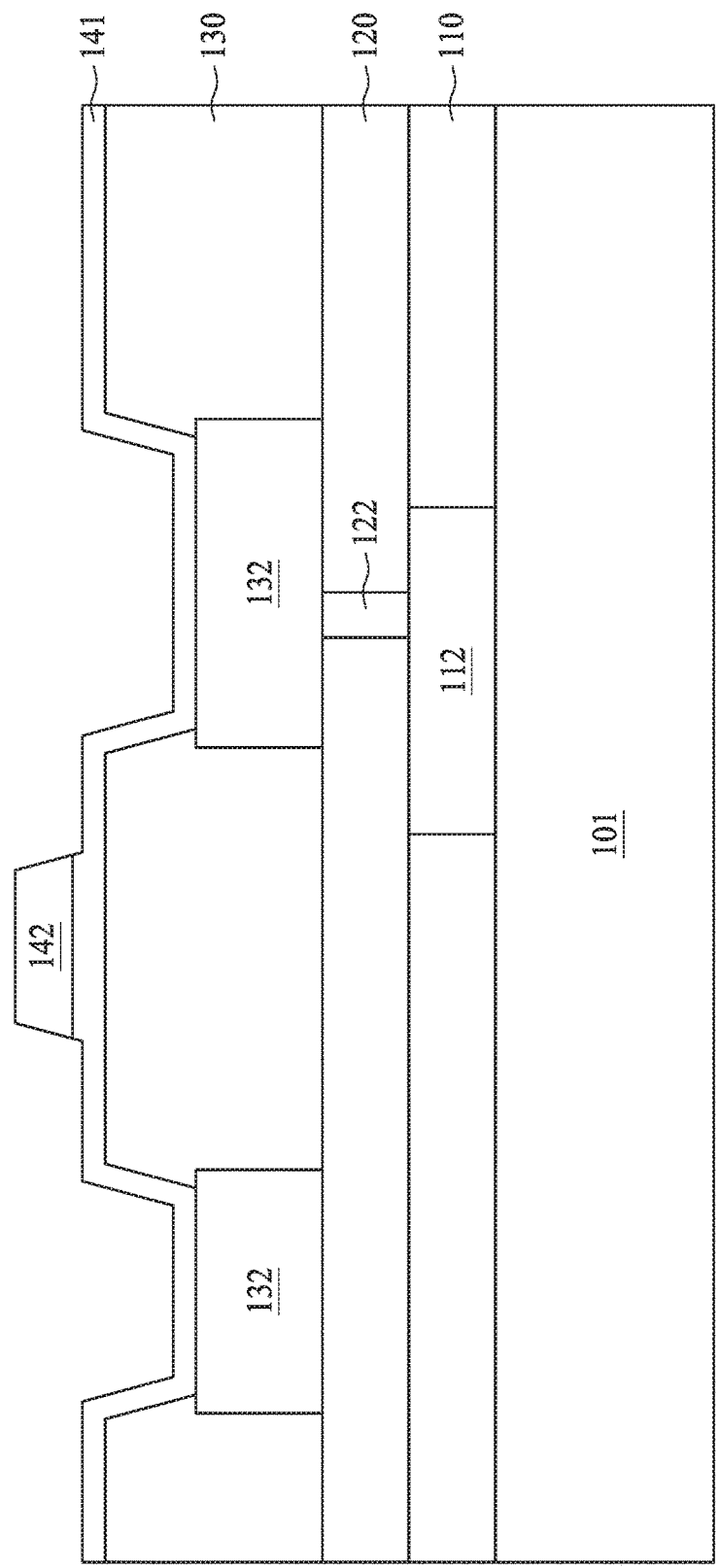
Figure 11:
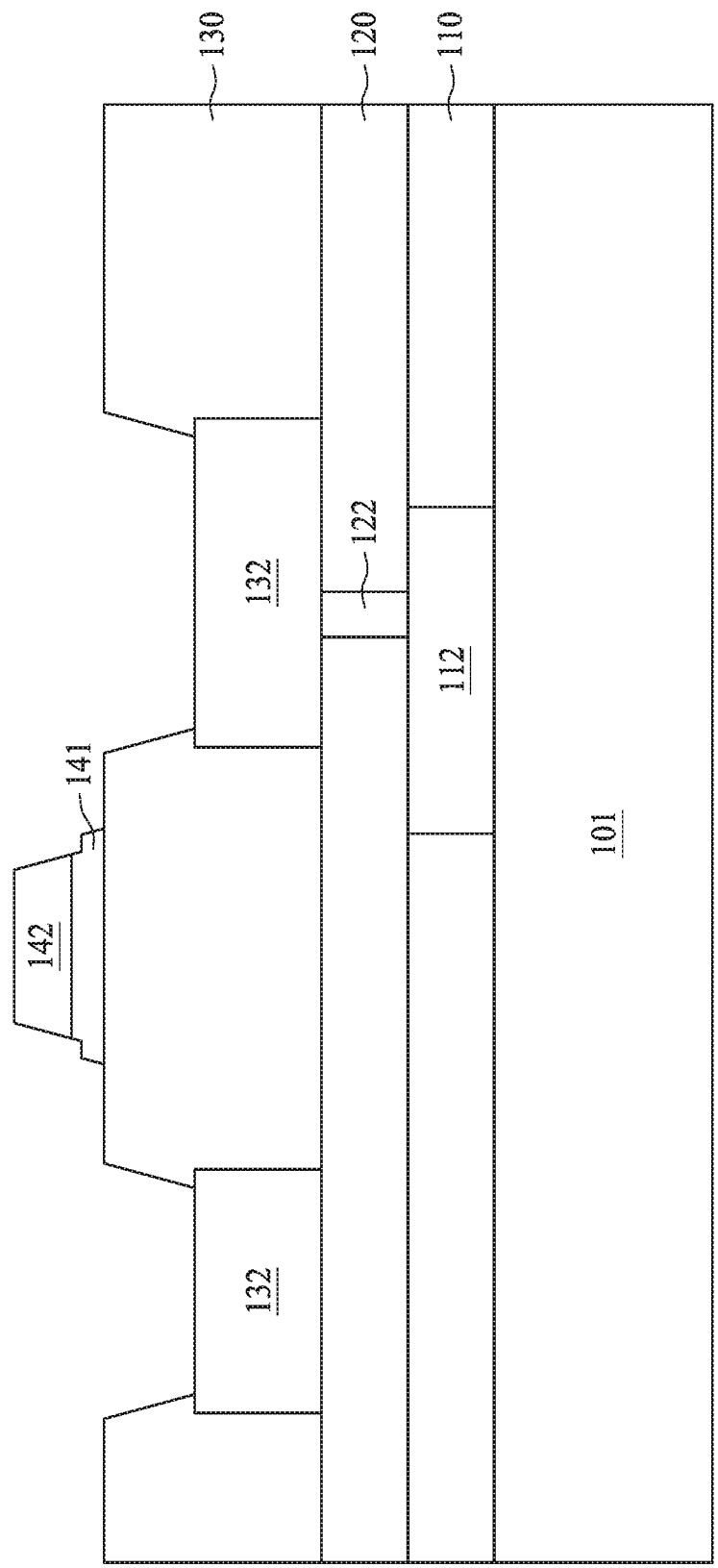

In FIG. 10, a portion of the magnetic material 142 may be removed through a wet etch. The remaining magnetic material 142 forms the magnetic core 142. A wet etching agent for the wet etch may include a I-IF solution, a $HNO_3$ solution, a $CH_3COOH$ solution, combinations thereof, or other suitable solution. Although the etch stop layer 141 is acid resistant against the wet etching agent, however, an upper portion of the etch stop layer 141 may be still etched away during the wet etch. The etched away portion of the etch stop layer 141 has a thickness of d2 as better illustrated in FIG. 2A to FIG. 2C, in FIG. 11, a portion of the etch stop layer 141 may be removed through a non-chemical etch procedure, such as a dry etch, to at least expose the lower coil segment 132 again.

Figure 12:
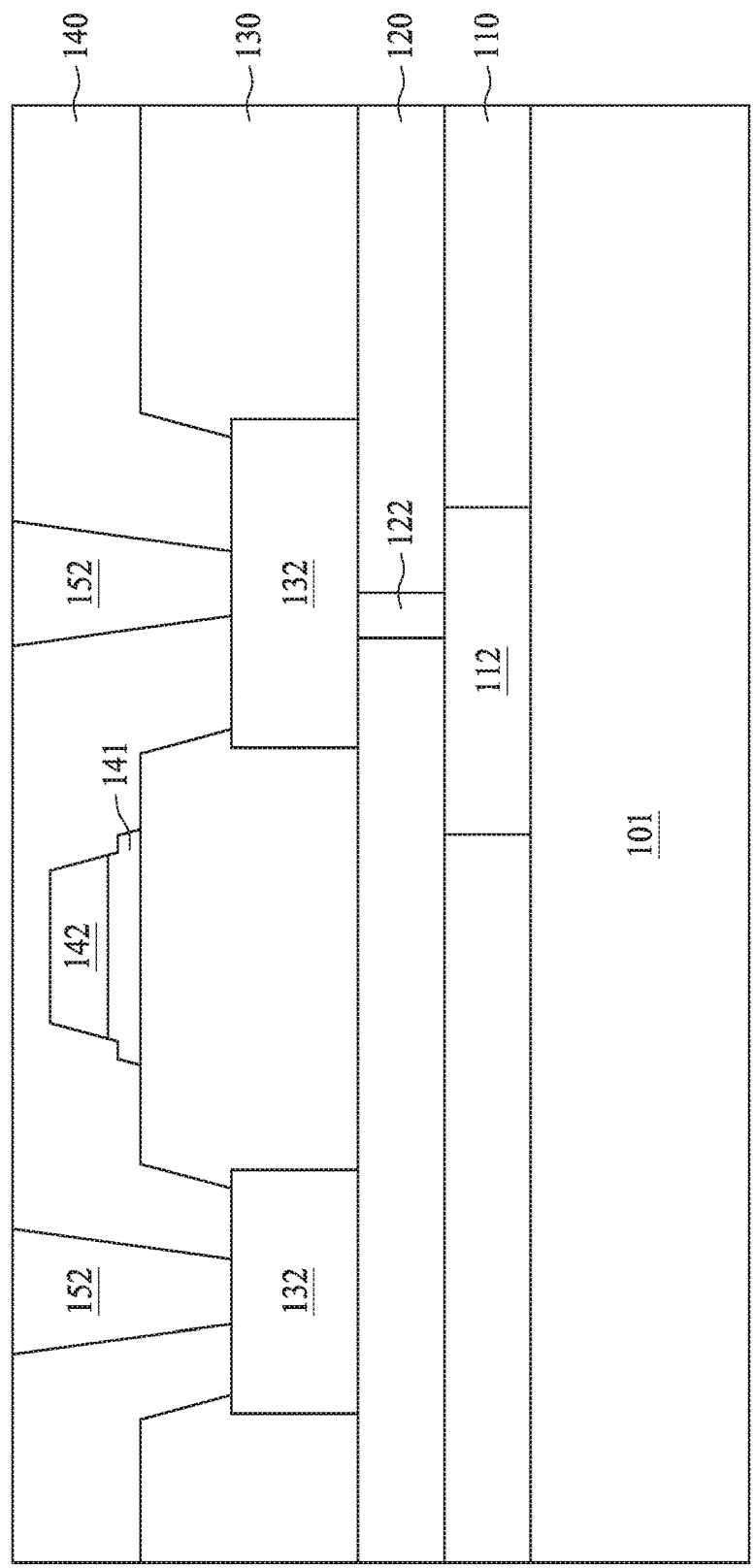

Next, as illustrated in FIG. 12, a fourth passivation layer 140 is formed over the magnetic core 142 and the third passivation layer 130. The fourth passivation layer 140 may be comprised of the same material as the first passivation layer 110 and may be formed by CVD, PVD, or any other suitable processes of formation, in some embodiments. Alternatively, the fourth passivation layer 140 may include other suitable materials different from the dielectric materials in the first passivation layer 110. The third passivation layer 112 may have a thickness between about 5 μm and about 10 μm, however, other ranges of thickness are also possible, depending on the designs and requirements of the semiconductor device 100.

After the fourth passivation layer 140 is formed, the vias 152 may be formed, e.g., by forming openings for the vias 152 through the fourth passivation layer 140 using, e.g., a lithography and etching process. The vias 152 may be formed adjacent to opposing sidewalls of the magnetic core 142. After the openings for vias 152 have been formed, the vias 152 may be formed using a seed layer (not shown) and a plating process, such as electrochemical plating, although other processes of formation, such as sputtering, evaporation, or PECVD process, may alternatively be used depending upon the desired materials. Once the openings for vias 152 have been filled with conductive material such as copper, any excess conductive material outside of the openings for vias 152 may be removed, and the vias 152 and the fourth passivation layer 140 may be planarized using, for example, a CMP process.

Figure 13:
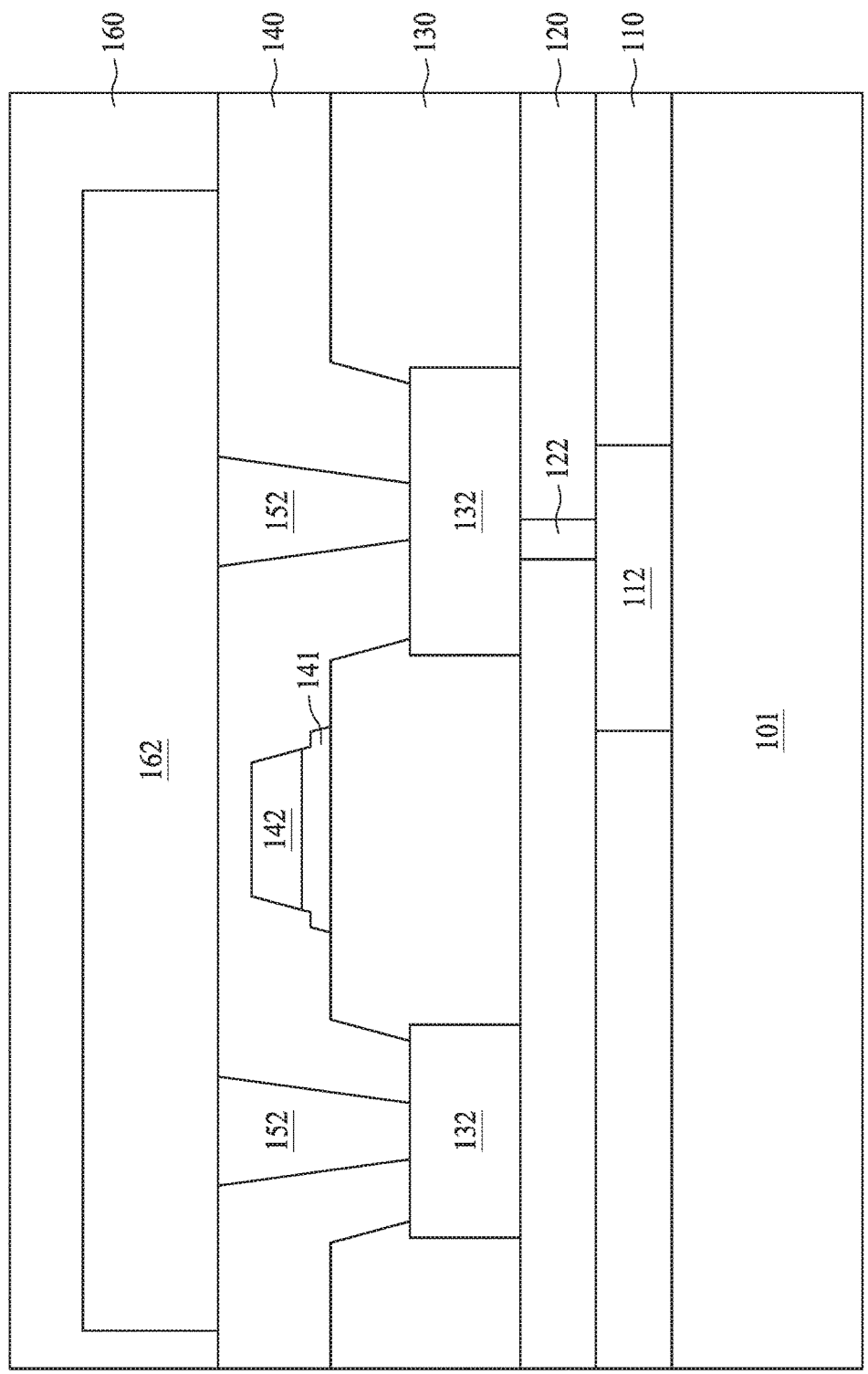

Next, referring to FIG. 13, the upper coil segment 162 is formed over the fourth passivation layer 140. In some embodiments, the upper coil segment 162 is made of copper. In one embodiment, the upper coil segment 162 has a thickness in a range between about 10 um and about 15 um, such as about 12 um. Other dimensions are possible and may depend on, for example, the functional requirements for the integrated inductors 168 and process technologies.

Next, a fifth passivation layer 160 may be formed over the fourth passivation layer 140 and the upper coil segment 162. The fifth passivation layer 160 may be comprised of the same material as the first passivation layer 110 and may be formed by CVD, PVD, or any other suitable processes of formation, in some embodiments. Alternatively, the fifth passivation layer 160 may include other suitable materials different from the dielectric materials in the first passivation layer 110. The thickness of the fifth passivation layer 160 may be larger than the thickness of the upper coil segment 162 so that upper coil segment 162 is encapsulated in the sixth passivation layer 160 and protected from outside environment, in some embodiments, one or more passivation layers may be formed over the fifth passivation layer 160. Referring back to FIG. 1, conductive terminals such as solder balls 172 can be formed over the fifth passivation layer 160 in order to make external connection to a voltage source.

Some embodiments of the present disclosure provide a semiconductor structure, including: a substrate; a first passivation layer over the substrate; a second passivation layer over the first passivation layer; a magnetic layer in the second passivation layer; and an etch stop layer between the magnetic layer and the first passivation layer, wherein the etch stop layer includes at least one acid resistant layer, and the acid resistant layer includes a metal oxide.

Some embodiments of the present disclosure provide a semiconductor structure, including: a substrate; a first passivation layer over the substrate; a second passivation layer over the first passivation layer; a third passivation layer over the second passivation; a lower coil segment in the first passivation layer; an upper coil segment in the third passivation layer; a magnetic core in the second passivation layer and insulated from the lower coil segment and the upper coil segment, wherein the magnetic core includes an upper surface and a lower surface opposite to the upper surface; an acid resistant layer around the lower surface of the magnetic core, the acid resistant layer including a central portion and an edge portion, the edge portion laterally extruding from the central portion, and the edge portion having an upper surface lower than an upper surface of the central portion.

Some embodiments of the present disclosure provide a method for manufacturing a semiconductor device, including: providing a semiconductor substrate; forming a lower coil segment over the semiconductor substrate; forming a passivation layer over the semiconductor substrate and the lower coil segment; removing an upper portion of the passivation layer to expose an upper surface of the lower coil segment; blanket depositing a stress buffer layer over the passivation layer and the lower coil segment; performing an oxygen treatment upon the stress buffer layer to obtain an acid resistant layer; and blanket depositing a magnetic material over the acid resistant layer.

The foregoing outlines features of several embodiments so that those skilled in the art may better understand the aspects of the present disclosure. Those skilled in the art should appreciate that they may readily use the present disclosure as a basis for designing or modifying other operations and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

Moreover, the scope of the present application is not intended to be limited to the particular embodiments of the process, machine, manufacture, composition of matter, means, methods and steps described in the specification. As one of ordinary skill in the art will readily appreciate from the disclosure of the present invention, processes, machines, manufacture, compositions of matter, means, methods, or steps, presently existing or later to be developed, that perform substantially the same function or achieve substantially the same result as the corresponding embodiments described herein may be utilized according to the present invention. Accordingly, the appended claims are intended to include within their scope such processes, machines, manufacture, compositions of matter, means, methods, or steps.

What is claimed is:

1. A semiconductor structure, comprising:
   a substrate;
   a first passivation layer over the substrate;
   a second passivation layer over the first passivation layer;
   a magnetic layer in the second passivation layer; and
   an etch stop layer between the magnetic layer and the first passivation layer, wherein the etch stop layer is in contact with the magnetic layer, and the etch stop layer includes at least one acid resistant layer, and the acid resistant layer includes a metal oxide.

2. The semiconductor structure of claim 1, wherein the metal oxide includes tantalum (Ta) oxide.

3. The semiconductor structure of claim 1, wherein the metal oxide includes titanium (Ti) oxide.

4. The semiconductor structure of claim 1, wherein the etch stop layer further includes at least one stress buffer layer.

5. The semiconductor structure of claim 4, wherein the stress buffer layer includes a metal.

6. The semiconductor structure of claim 5, wherein the metal includes Ta.

7. The semiconductor structure of claim 5, wherein the metal includes Ti.

8. The semiconductor structure of claim 4, wherein the stress buffer layer is below the acid resistant layer.

9. The semiconductor structure of claim 8, wherein the acid resistant layer and the stress buffer layer are orderly stacked in a repeating manner.

10. The semiconductor structure of claim 1, further comprising a plurality of vias adjacent to opposing sidewalls of the magnetic layer, wherein the vias extend through the second dielectric layer.

11. A semiconductor structure, comprising:
    a first passivation layer;
    a second passivation layer over the first passivation layer;
    a third passivation layer over the second passivation;
    a lower coil segment in the first passivation layer;
    an upper coil segment in the third passivation layer;
    a magnetic core in the second passivation layer and insulated from the lower coil segment and the upper coil segment, wherein the magnetic core includes an upper surface and a lower surface opposite to the upper surface; and
    an acid resistant layer around the lower surface of the magnetic core, the acid resistant layer including a central portion and an edge portion, the edge portion laterally extruding from the central portion, and the edge portion having an upper surface lower than an upper surface of the central portion.

12. The semiconductor structure of claim 11, further comprising a stress buffer layer around a lower surface of the acid resistant layer, wherein a sidewall of the stress buffer layer aligns with an outer edge of the edge portion of the acid resistant layer.

13. The semiconductor structure of claim 12, wherein the stress buffer layer is thinner than the central portion of the acid resistant layer.

14. The semiconductor structure of claim 12, further comprising another acid resistant layer around a lower surface of the stress buffer layer, wherein a sidewall of the another acid resistant layer aligns with the sidewall of the stress buffer layer.

15. The semiconductor structure of claim 14, further comprising another stress buffer layer around a lower surface of the another acid resistant layer, wherein a sidewall of the another stress buffer layer aligns with the sidewall of the another acid resistant layer.

16. The semiconductor structure of claim 11, wherein the acid resistant layer is acid resistant against a wet etching agent used to chemically etch the magnetic core.

17. The semiconductor structure of claim 12, wherein the stress buffer layer includes a metal, and the acid resistant layer includes an oxide of the metal.

18. The semiconductor structure of claim 11, further comprising a vias extending through the second dielectric layer to connect the upper coil segment with the lower coil segment.

19. A semiconductor structure, comprising:
a first passivation layer;
a second passivation layer over the first passivation layer;
a magnetic layer in the second passivation layer; and
an etch stop layer between the magnetic layer and the first passivation layer, wherein the etch stop layer includes an acid resistant layer, and the acid resistant layer includes a central portion and an edge portion laterally extruding from the central portion, and the edge portion has an upper surface lower than an upper surface of the central portion.

20. The semiconductor structure of claim 19, wherein the etch stop layer further includes a stress buffer layer below the acid resistant layer.

* * * * *